United States Patent

Colgan et al.

[11] Patent Number: 5,912,506
[45] Date of Patent: Jun. 15, 1999

[54] MULTI-LAYER METAL SANDWICH WITH TAPER AND REDUCED ETCH BIAS AND METHOD FOR FORMING SAME

[75] Inventors: Evan G. Colgan, Chestnut Ridge; Peter M. Fryer; James McKell Edwin Harper, both of Yorktown Heights; Kenneth P. Rodbell, Poughquag, all of N.Y.

[73] Assignee: International Business Machines Corporation, Armonk, N.Y.

[21] Appl. No.: 08/937,349

[22] Filed: Sep. 20, 1997

Related U.S. Application Data

[63] Continuation of application No. 08/730,432, Oct. 15, 1996, abandoned.

[51] Int. Cl.[6] .................................................. H01L 23/48
[52] U.S. Cl. ......................................... 257/750; 257/764
[58] Field of Search ................................. 257/52, 55, 59, 257/635, 750, 751, 764, 765

[56] References Cited

U.S. PATENT DOCUMENTS

| | | |
|---|---|---|
| 4,824,803 | 4/1989 | Us et al. . |
| 5,153,754 | 10/1992 | Whetten . |
| 5,162,933 | 11/1992 | Kakuda et al. ............................. 257/59 |
| 5,428,250 | 6/1995 | Ikeda et al. . |
| 5,464,500 | 11/1995 | Tsujimura et al. . |
| 5,477,087 | 12/1995 | Kawakita et al. ........................ 257/737 |
| 5,600,180 | 2/1997 | Kusaka et al. ........................... 257/737 |
| 5,648,146 | 7/1997 | Gotou et al. ............................... 257/72 |

OTHER PUBLICATIONS

"Low Resistance Gate Line for High–Resolution TFT/LCD Display", T. Tsujimura, H. Kitahara, A. Makita, P. Fryer and J. Batey.

Primary Examiner—Teresa M. Arroyo
Assistant Examiner—Roy Potter
Attorney, Agent, or Firm—Jay P. Sbrollini

[57] ABSTRACT

A multi-layer metal sandwich structure with taper and reduced etch bias formed on a substrate includes a first metal layer formed on the substrate and a second metal layer formed on the first metal layer. The width of the first metal layer is greater than the width of the second metal layer at the interface of the first metal layer and the second metal layer. The second metal layer has tapered side walls. The taper angle between each side wall and the intersection of the first and second metal layers is between 5° and 90°. The multi-layer metal sandwich may also include a third metal layer formed on the second metal layer.

12 Claims, 3 Drawing Sheets

MULTI-LAYER METAL SANDWICH WITH TAPER AND REDUCED ETCH BIAS AND METHOD FOR FORMING SAME

This is a continuation of application Ser. No. 08/730,432, filed Oct. 15, 1996 now abandoned.

BACKGROUND OF THE INVENTION

1. Field of the Invention

The invention relates to metal layers used in electronic devices, and more particularly, to metal layers formed on substrate. The invention is especially advantageous when applied to manufacturing processes for thin film transistors (TFTs) which are used in, for example, liquid crystal panels.

2. Description of the Related Art

A technique for forming a tri-layer metal structure is described in U.S. Pat. No. 5,428,250 to Ikeda et al. The tri-layer metal structure is formed on a glass substrate. The first layer is a Ta-M-N film, the second layer is a Ta film and the third (top) layer is a Ta-M-N film, where M is at least one atom selected from the group consisting of Molybdenum, Niobium, and Tungsten.

U.S. Pat. No. 5,153,754 to Whetten described a tri-layer metal structure formed on an LCD substrate where the first layer is a titanium (Ti) film, the second layer is a molybdenum (Mo) or aluminum (Al) film, and the third (top) layer is a titanium (Ti) film. In addition, column 6, lines 56–70 describe a process to taper etch the tri-layer metal structure. When the second layer is a molybdenum film, the tri-layer structure is formed by wet etching the titanium first layer with fluoroboric acid ($HBF_4$), wet etching the molybdenum second layer with PAWN (phosphoric acid, acetic acid, water and nitric acid), and dry etching the titanium third layer in a plasma barrel etcher with an atmosphere of $CF_4$ and $O_2$ (or $SF_6$ and $O_2$). When the second layer is an aluminum film, the tri-layer structure is formed in a single etch step by an RIE etch of $BCl_3$, $CCl_4$ and $O_2$.

U.S. Pat. No. 5,464,500 to Tsujimura et al. describes a tri-layer metal structure formed on a glass substrate. A silicon oxide layer is formed on the glass substrate. The first metal layer of Aluminum (Al) is formed on the silicon oxide layer. The second metal layer of aluminum oxide is formed on the first metal layer. The third metal layer of molybdenum is formed in the aluminum oxide layer. Beginning at column 3, line 60, a process for taper etching the tri-metal layer is described. As a result, the cross section of the first metal layer of aluminum is formed with a taper angle.

U.S. Pat. No. 4,824,803 to Us et al. describes a tri-layer metal structure formed on a glass layer wherein the first metal layer is a titanium (Ti) film, the second metal layer is an Aluminum (Al) film, and the third metal layer is a titanium film. As described beginning at column 2, line 45, the tri-metal structure is formed in a single RIE etch step of a chlorine based chemistry. As shown in FIGS. 1a and 1b, the RIE etch step results in a non-tapered structure with vertical sidewalls.

All of the above prior art methods are directed to forming multi-layer metal structures. However, none address all three of the problems below:

(a) thinning of additional metal layers crossing the edges of the multi-layer metal structure;
(b) shorts or pinholes formed in one or more insulator layers above multi-layer metal structure due to near vertical or undercut edges; and
(c) controlling the effective width of the multi-layer structure when using an extended non-directional overetch.

SUMMARY OF THE INVENTION

The above-stated problems and related problems of the prior art are solved with the principles of the present invention, multi-layer metal sandwich with taper and reduced etch bias and method for forming same. A multi-layer metal sandwich structure formed on a substrate includes a first metal layer formed on the substrate and a second metal layer formed on the first metal layer. The second metal layer has tapered side walls. The width of the first metal layer is different than the width of the second metal layer at the interface of the first metal layer and the second metal layer. The multi-layer metal sandwich may also include a third metal layer formed on the second metal layer. The second metal layer may also be substantially thicker than the first or third metal layers.

A method for forming the multi-layer metal sandwich with taper and reduced etch bias on a substrate includes the steps of forming a three-layer sandwich of metal on the substrate by forming a first metal layer on the substrate, forming a second metal layer on the first metal layer, and forming a third metal layer on the second metal layer. A resist pattern is formed on the three-layer sandwich, wherein the resist pattern defines etch areas in the three-layer sandwich. The etch areas are exposed to a first etchant that taper etches the second metal layer while not attacking the first metal layer. The etch areas are then etched using a directional etch process, which etches the first metal layer. The resist pattern in then removed. The third metal layer may be removed.

Preferably, the first metal layer is titanium (or a titanium alloy), the second metal layer is Aluminum (or an Aluminum alloy), and the third metal layer is Molybdenum (or Molybdenum alloy) or Copper (or a Copper alloy) or other refractory metal (or alloy). In this case, the first etching process for taper etching the aluminum second layer utilizes a wet etchant that is a mixture of phosphoric acid, nitric acid, acetic acid, and water, and the second etching process for etching the titanium first metal layer utilizes an RIE etching process.

DETAILED DESCRIPTION OF THE PREFERRED EMBODIMENTS

Figure 1:
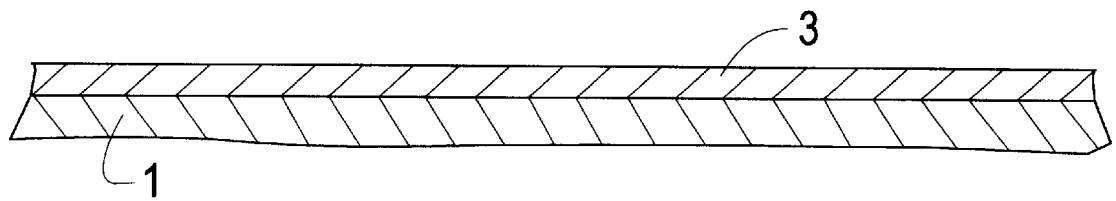
FIG. 1 shows a cross-sectional view of a substrate with the first metal layer illustrating step (1) of the method for forming a metal sandwich structure according to the present invention.

Referring to the drawing, FIGS. 1 to 7 are cross-sectional views illustrating the steps of the method for forming the metal sandwich structure according to the present invention.

In FIG. 1, a first metal layer 3 is formed on a substrate 1. The substrate 1 preferably is formed of transparent and non-conductive glass. The first metal layer 3 is a metal that adheres well to the substrate 1 yet does not interfere with the taper etching of the second metal layer 5, which is described in more detail below. The first metal layer 3 may be a titanium (Ti) layer formed by, for example, sputter depositing the titanium. In the alternative, the first metal layer 3 may be a layer of an alloy of titanium (Ti) and one or more other metals (for example, Vanadium, Chromium, Zirconium, Niobium, Molybdenum, Hafnium, Tantalum, Tungsten, and Rhenium) formed by, for example, sputter depositing the alloy. In another alternative, the first metal layer 3 may be a titanium nitride (TiN) (or a mixture of metal nitrides) formed by, for example, sputter depositing the metal nitride. The first metal layer preferably has a thickness of 500 Å.

Figure 2:
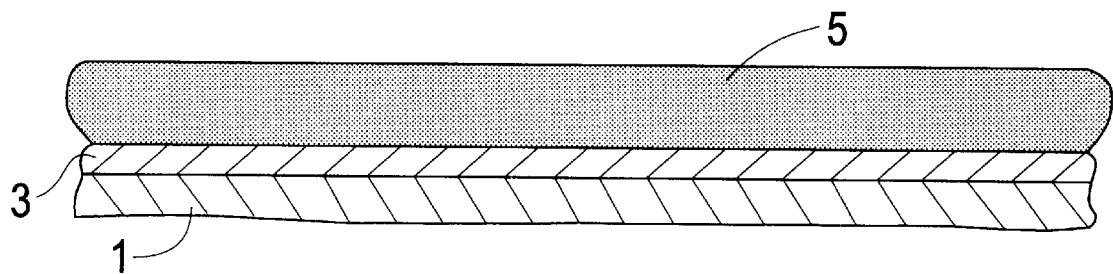
FIG. 2 shows a cross-sectional view of a substrate with the first and second metal layers illustrating step (2) of the method for forming a metal sandwich structure according to the present invention.

In FIG. 2, a second metal layer 5 is formed on the first metal layer 3. The second metal layer 5 is a metal with low resistivity that is also suitable for taper etching. The second metal layer 5 may be an Aluminum (Al) layer formed by, for example, sputter depositing the Aluminum. In the alternative, the second metal layer 5 may be a layer of an alloy of Aluminum (Al) and one or more other metals (for example, Silicon, Copper, Germanium, Tin, Indium, Palladium, Platinum, Scandium, Yttrium, Lanthanum, Titanium, Zirconium, Hafnium, Vanadium, Niobium, Tantalum, Chromium, Molybdenum, Tungsten, Cerium, Praseodymium, Neodymium, Samarium, Europium, Gadolinium, Terbium, Dysprosium, Holmium, Erbium, Thulium, Ytterbium, or Lutetium) formed by, for example, sputter depositing the alloy. The second metal layer 5 preferably has a thickness in the range from 1000 Å to 4000 Å.

Figure 3:
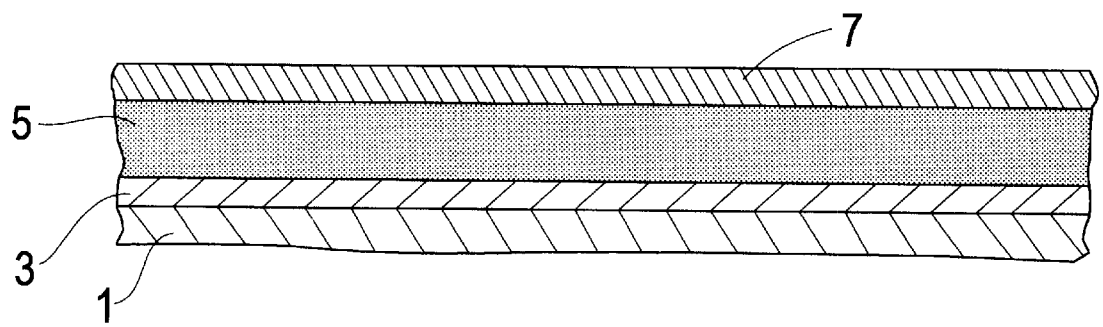
FIG. 3 shows a cross-sectional view of a substrate with the first, second and third metal layers illustrating step (3) of the method for forming a metal sandwich structure according to the present invention.

In FIG. 3, a third metal layer 7 is formed on the second metal layer 5. The third metal layer 7 is a metal that is suitable for the taper etching of the second metal layer 5. The third metal layer 7 may be a Molybdenum (Mo) layer formed by, for example, sputter depositing the Molybdenum. In the alternative, the third metal layer 7 may be a Copper (Cu) layer formed by, for example, sputter depositing the Copper. In another alternative, the third metal layer 7 may be a layer of an alloy of Molybdenum (Mo) and one or more other metals (for example, Titanium, Vanadium, Chromium, Zirconium, Niobium, Hafnium, Tantalum, Tungsten, and Rhenium). The third metal layer 7 preferably has a thickness of 500Å.

Figure 4:
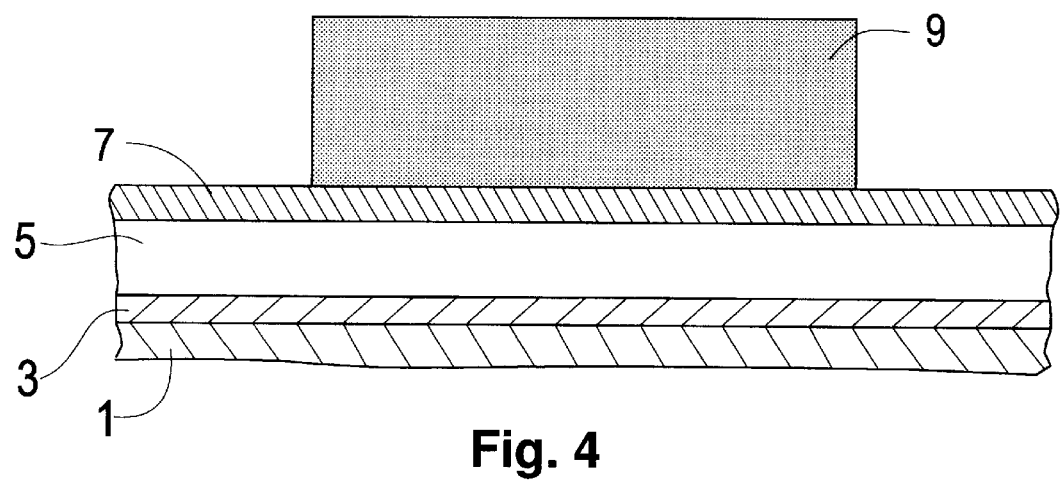
FIG. 4 shows a cross-sectional view of a substrate with layers illustrating step (4) of the method for forming a metal sandwich structure according to the present invention.

Next, as shown in FIG. 4, a first resist pattern 9 is formed on the third metal layer 7 exposing an etch area (i.e., an area to be etched).

Figure 5:
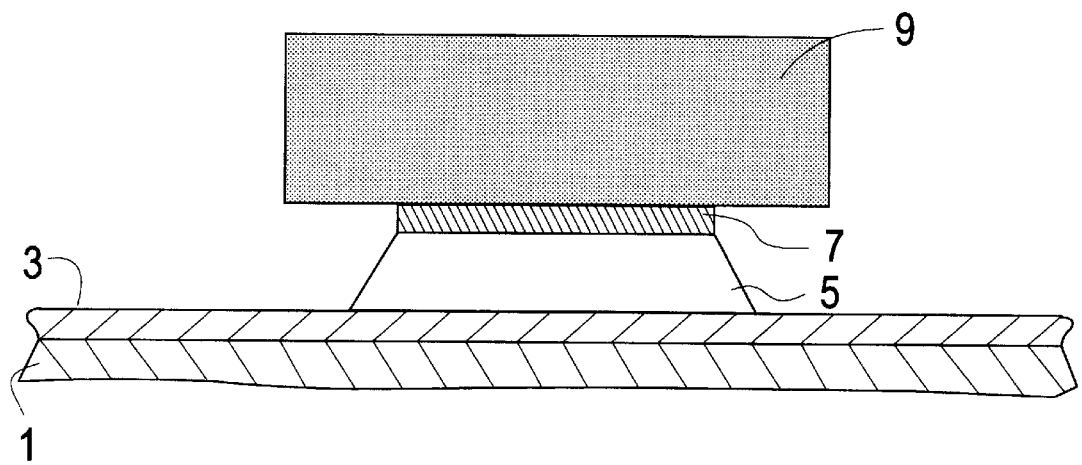
FIG. 5 shows a cross-sectional view of a substrate with layers illustrating step (5) of the method for forming a metal sandwich structure according to the present invention.

The etch area exposed by the resist pattern 9 is then subjected to a wet etch solution that etches the third metal layer 7 faster than the second metal layer 5, while not attacking the first metal layer 3. Because the third metal layer 7 etches faster that the second metal layer 5, the cross section of the second metal layer 5 has a taper angle as shown in FIG. 5. Preferably, the taper angle of the second metal layer is between 5 and 90 degrees. In the example above wherein the first metal layer 3 is a titanium (Ti) layer, the second metal layer 5 is a Aluminum (Al) layer, and the third metal layer 7 is a Molybdenum (Mo) layer, the first etching process preferably utilizes a wet etchant that is a mixture of phosphoric acid, nitric acid, acetic acid, and water. A more detailed description of the formation of the taper angle of the second metal layer 5 may be found in W. Kern et al., "Improved Reliability of Electron Devices Through Optimized Coverage of Surface Topographt," 11th Annual Proceedings Reliability Physics, 1973, pp. 214–223, herein incorporated by reference in its entirety.

Figure 6:
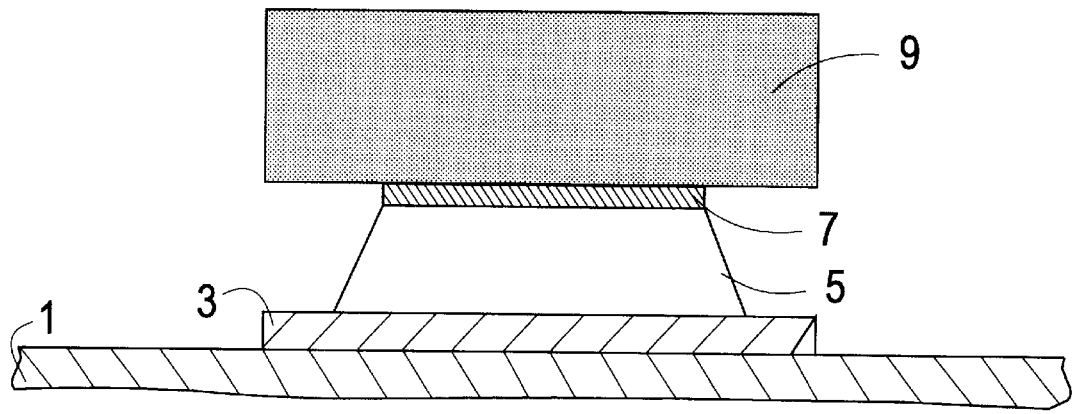
FIG. 6 shows a cross-sectional view of a substrate with layers illustrating step (6) of the method for forming a metal sandwich structure according to the present invention.

The etch areas exposed by the resist pattern is then exposed to a second etching process which etches the first metal layer 3, but which does not attack the second and third metal layers 5 and 7. Moreover, the second etching process preferably minimizes the lateral etching of the first metal layer 3 with respect to the patterned resist 9. In the example above wherein the first metal layer 3 is a titanium (Ti) layer, the second metal layer 5 is a Aluminum (Al) layer, and the third metal layer 7 is a Molybdenum (Mo) layer, the second etching process preferably utilizes a chlorine based directional RIE etch process, which is described in more detail in T. P. Chow et al., "Dry Etching for Microelectronics," Elsevier Pub., N.Y., 1984, Chapter 2, hereinafter incorporated by reference in its entirety. Alternatively, other directional etching techniques may be used, such as ion milling. The resulting structure is shown in FIG. 6. Importantly, the directional etching process minimizes the lateral etch of the first metal layer 3 with respect to the patterned resist 9. This results in an interface between the first metal layer 3 and the second metal layer 5 wherein the widths of the first and second metal layers are substantially different.

Figure 7:
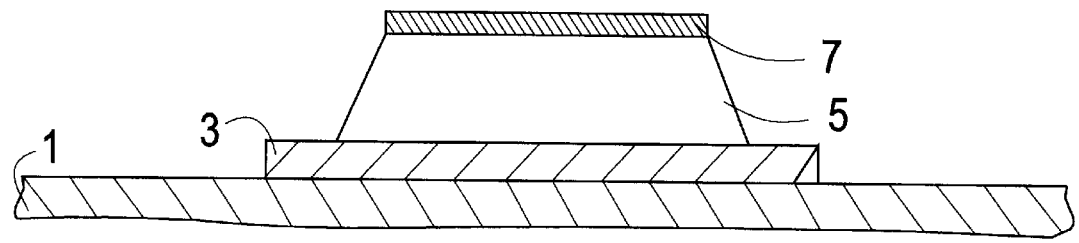
FIG. 7 shows a cross-sectional view of a substrate with the metal sandwich structure according to the present invention.

Finally, the resist pattern 9 is removed. The resulting structure is a tri-layer metal layer formed on the substrate as shown in FIG. 7.

The third metal layer 7 may be removed in subsequent processing steps. However, it may be beneficial to retain the third metal layer 7. For example, when the second metal layer is Aluminum (Al), the first and third metal layers suppress hillocks that may form in the middle Aluminum layer during subsequent high temperature processing steps.

In addition, in a TFT device, for example, an insulator layer and one or more additional metal layers are typically formed above the second metal layer. If the second layer is not tapered, the additional metal layers that cross over the non-tapered vertical sidewall of the second metal layer may experience thinning, which may increase the resistance of the additional metal layer(s). Moreover, if the second layer is not tapered, shorts or pinholes typically form in the insulator layer above the non-tapered vertical sidewall of the second metal layer. Thus, the taper etching of the second metal layer avoids such thinning of the additional metal layer(s) and shorts in the insulator layer formed above the second metal layer.

However, the taper etching step as described above is difficult to control and typically reduces the lateral width of the second metal layer with respect to patterned resist. Advantageously, the second etching step of the first metal layer as described above provides the capability of controlling the width of the first metal layer. This may be advantageous, for example, when the first and second metal layers (and possibly third metal layer) are used as a gate electrode in a TFT device. In this case, the width of the first metal layer characterizes the channel length of the TFT device. Thus, in this scenario, the second etching step of the first metal layer provides the capability of controlling the channel length of the TFT device, which is desirable for the designers of the device.

Although the invention has been shown and described with respect to the particular embodiments thereof, it should be understood by those skilled in the art that the foregoing and various other changes, omissions, and additions in the form and detail thereof may be made without departing from the spirit and scope of the invention.

We claim:

1. A device comprising:

a substrate;

a first metal layer formed on the substrate; and a second metal layer formed on the first metal layer and having tapered side walls, wherein width of the first metal layer is greater than width of the second metal layer at the interface of the first metal layer and the second metal layer, wherein a taper angle between each of said tapered side walls and said interface of the first metal layer and the second metal layer is between 5 and 90 degrees, and wherein said first metal layer comprises titanium.

2. The device of claim 1, wherein the substrate is a glass substrate.

3. The device of claim 1, further comprising a third metal layer formed on the second metal layer.

4. The device of claim 3, wherein the third metal layer comprises one of molybdenum and copper.

5. The device of claim 1, wherein the second layer comprises a metal having a resistivity less than 10 micro-ohm-cm.

6. The device of claim 5, wherein the second metal layer comprises aluminum.

7. A device comprising:

a substrate;

a first metal layer formed on the substrate; and a second metal layer formed on the first metal layer and having tapered side walls, wherein width of the first metal layer is greater than width of the second metal layer at the interface of the first metal layer and the second metal layer, wherein a taper angle between each of said tapered side walls and said interface of the first metal layer and the second metal layer is between 5 and 90 degrees, and wherein said first metal layer comprises a first metal, and said second metal layer comprises a second metal layer different from said first metal layer.

8. The device of claim 7, wherein the substrate is a glass substrate.

9. The device of claim 7, further comprising a third metal layer formed on the second metal layer, wherein said third layer comprises a third metal different from said first metal and said second metal.

10. The device of claim 9, wherein the third metal comprises one of molybdenum and copper.

11. The device of claim 7, wherein the first metal comprises titanium.

12. The device of claim 7, wherein the second metal comprises aluminum.

* * * * *